(12) United States Patent
Tsai

(10) Patent No.: US 10,495,974 B2
(45) Date of Patent: Dec. 3, 2019

(54) TARGET FEEDING SYSTEM

(71) Applicant: Taiwan Semiconductor Manufacturing Co., Ltd., Hsinchu (TW)

(72) Inventor: Ming-Hsun Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 111 days.

(21) Appl. No.: 15/704,437

(22) Filed: Sep. 14, 2017

(65) Prior Publication Data
US 2019/0079401 A1 Mar. 14, 2019

(51) Int. Cl.
*G03F 7/00* (2006.01)
*G03F 7/20* (2006.01)

(52) U.S. Cl.
CPC .......... *G03F 7/2004* (2013.01); *G03F 7/2008* (2013.01); *G03F 7/70325* (2013.01)

(58) Field of Classification Search
USPC ................................................... 250/492.1
See application file for complete search history.

(56) References Cited

U.S. PATENT DOCUMENTS

| | | | | |
|---|---|---|---|---|
| 8,003,962 | B2* | 8/2011 | Someya | H05G 2/006 250/423 R |
| 8,154,000 | B2* | 4/2012 | Hergenhan | H05G 2/003 250/493.1 |
| 9,052,616 | B2* | 6/2015 | Rodak | G03F 7/70991 |
| 10,034,362 | B2* | 7/2018 | Kuritsyn | H05G 2/003 |
| 2006/0192155 | A1 | 8/2006 | Algots et al. | |

FOREIGN PATENT DOCUMENTS

| TW | 563187 | 11/2003 |
|---|---|---|
| TW | 201448674 | 12/2014 |

* cited by examiner

*Primary Examiner* — Phillip A Johnston
(74) *Attorney, Agent, or Firm* — Haynes and Boone, LLP

(57) ABSTRACT

The present disclosure provides an extreme ultraviolet (EUV) lithography system. The system includes an EUV scanning module; an EUV collector to collect EUV radiation and direct the same to the EUV scanning module; a droplet generator for generating droplets of a molten form of a metal; a pulse laser generator to act on the droplets of the molten form of the metal to generate plasma as a source of the EUV radiation; and a target feeding system. The target feeding system includes a container for holding the metal, a heating device configured to heat the metal in the container to a temperature higher than a melting temperature of the metal, and a feeding tube having an upstream end connecting to the container and a downstream end connecting to the droplet generator such that the container is in fluid communication with the droplet generator.

20 Claims, 7 Drawing Sheets

TARGET FEEDING SYSTEM

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. Some EUV scanners provide 4× reduction projection printing, similar to some optical scanners, except for that the EUV scanners use reflective rather than refractive optics, i.e., mirrors instead of lenses.

Therefore, while existing lithography techniques have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
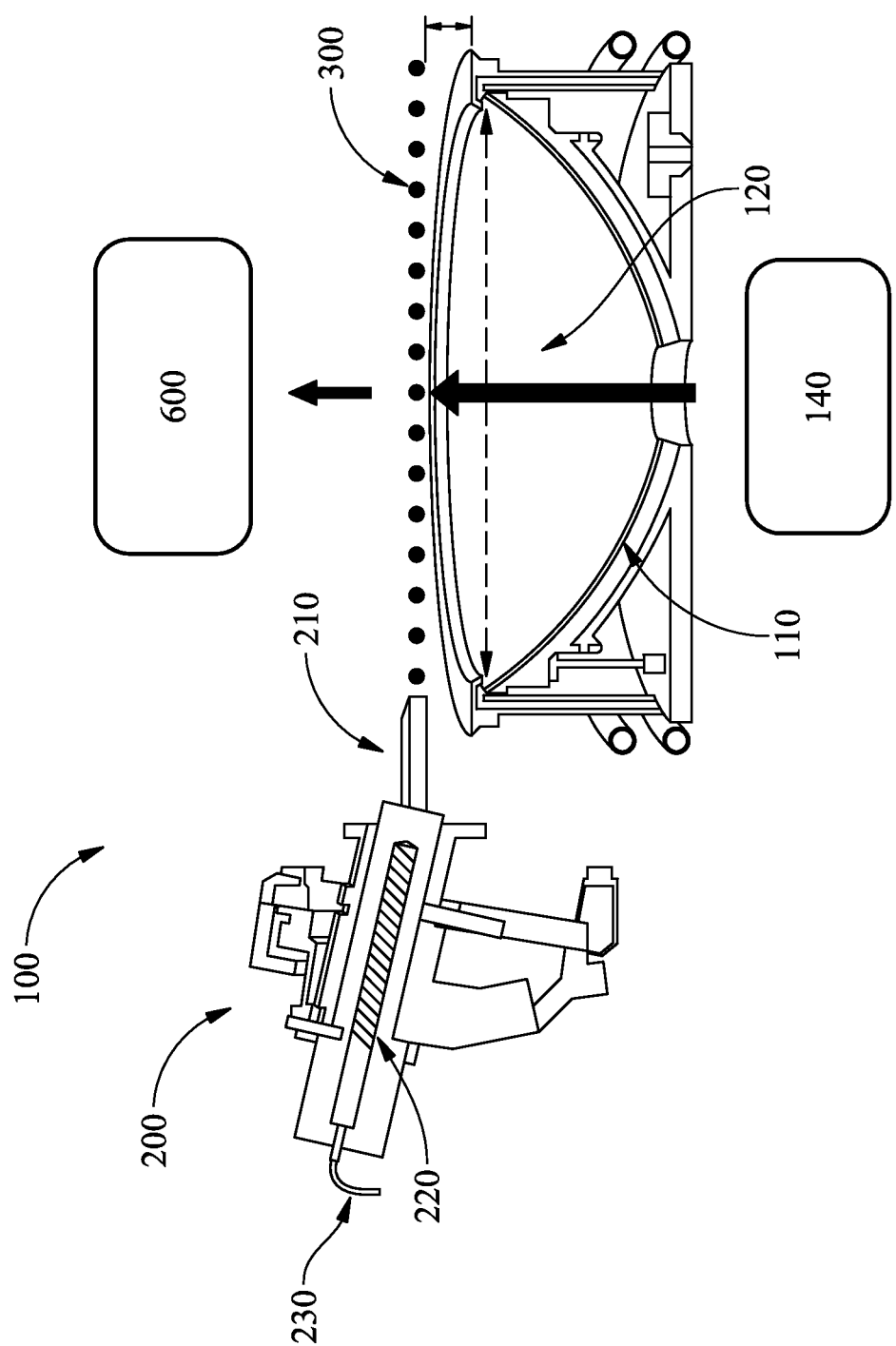
FIG. 1 is a schematic view of an EUV lithography system with a droplet generator.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

EUVL is widely believed to be the next generation of main-stream lithography for the semiconductor industry. EUVL is usually illuminated by a laser-produced plasma (LPP) EUV light source. The operation of an LPP EUV light source involves generation of plasma by irradiating droplets of a target or seed with high energy laser pulses. Several target materials have been proposed, including xenon, water, tin and lithium. When the target material is a metal such as tin and lithium, the target has to be melted and fed to a droplet generator. The droplet generator then expels small droplets of the target into a source plasma vessel. The target droplets are usually about tens of microns in diameter. In the case of tin, the droplet has a diameter of about 25 microns. To stabilize the tin or lithium droplets, sometimes the source plasma vessel is filled with hydrogen. Hydrogen could react with lithium and tin to form lithium or tin hydride, reducing contaminating particles on the collector.

Target droplets in the source plasma vessel are then vaporized by irradiation of high power laser pulses to form laser-produced plasma. Target droplets not vaporized by laser pulses are to be caught by a catching device, usually referred to as a catcher. The laser pulses are directed through an output window integrated with a collector (also referred to as LPP collector or EUV collector). The output window adopts a suitable material substantially transparent to the laser pulses. The laser pulse source is usually a $CO_2$ drive laser. The EUV photons emitted from the excited laser-produced plasma are then collected by a collector. The collector is designed with proper coating material and shape, functioning as a mirror for EUV collection, reflection and focus. In some embodiments, the collector is designed to have an ellipsoidal geometry. In some embodiments, the coating material of the collector is similar to the reflective multilayer of the EUV reticle. In some examples, the coating material of the collector includes multiple layers (such as a plurality of Mo/Si film pairs) and may further include a capping layer (such as Ru) coated on the multiple layers to substantially reflect the EUV light. In some embodiments, the collector may further include a grating structure designed to effectively scatter the laser beam directed onto the collector. For example, a silicon nitride layer is coated on the collector and is patterned to have a grating pattern.

The collector reflects the EUV photons to an illuminator that includes a series of reflection optics, sometimes referred to as mirrors. The illuminator is maintained in a vacuum environment to avoid EUV intensity loss because EUV is easily absorbed by gas molecules. The EUV is then directed by the illuminator to a reticle on a reticle stage. The reticle includes a substrate with a suitable material, such as a low thermal expansion material (LTEM) or fused quartz. In various examples, the LTEM includes $TiO_2$ doped $SiO_2$, or other suitable materials with low thermal expansion. The reticle includes multiple reflective layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The reticle may further include a capping layer, such as ruthenium (Ru), disposed on the multiple layers for protection. The reticle further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask. The IC pattern is scanned off the reticle towards a series of reflection lenses that reduce the IC pattern to one-fourth of its original size before scanning it across a chip area on a wafer.

Conventionally, all of the foregoing EUVL system components are integrated in a relatively tight space and the amount of target material that can be stored in the droplet generator is quite limited. Whenever the target runs out, the EUVL system has to be shutdown in order for the target material to be replenished. In some instances, after the target material is refilled, the source plasma vessel has to be cleaned, purged, and refilled with hydrogen. This refill process disrupts the semiconductor manufacturing process, reduces throughput and may introduce unwanted process variables.

FIG. 1 is a schematic diagrammatic view of an EUVL system 100. A target 220, usually a metal such as tin and lithium, is melted in a droplet generator 200. The droplet generator 200 draws pressure from an inert gas feed 230 to expel droplets 300 of the molten target 220 from nozzle 210 into the source plasma vessel 120. A pulse laser generator 140 irradiates laser pulses at the droplets 300, vaporizing them into excited plasma. Photons emitted from the laser-produced plasma are collected by the collector 110 before transmitting to the EUV scanning module 600. Although not shown, the EUV scanning module 600 includes an illuminator, a reticle stage, projection optics, and a mask stage. The EUV radiation from the collector 110 is focused by multiple reflectors and mirrors of the illuminator and redirected to a reticle on the reticle stage. A pattern on the reticle is then scanned off the reticle, reduced to one quarter of its original size, and scanned onto a chip area of a wafer on the wafer stage. The droplet generator 200 has a limited capacity for the target materials and as descried above, requires replenishment from time to time, causing undesirable disruption of the manufacturing processes.

Figure 2:
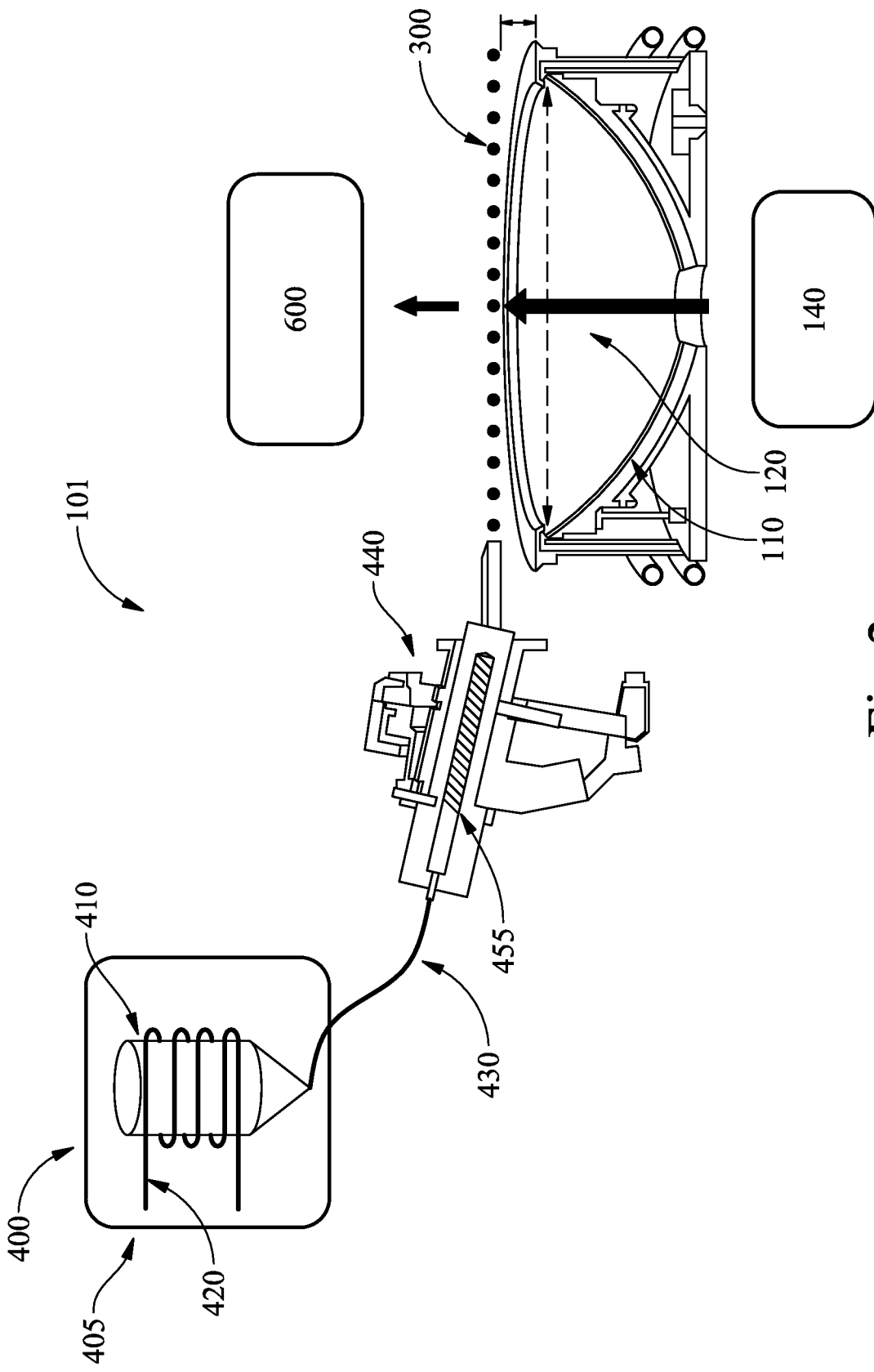
FIG. 2 is a diagrammatic view of an EUV lithography system with a target feeding system, according to aspects of the present disclosure.

Shown in FIG. 2 is an EUVL system 101, according to aspects of the present disclosure. Similar to the EUVL system 100 shown in FIG. 1, the EUVL system 101 includes a droplet generator 440 that expels droplets 300 of the molten target 455 into the source plasma vessel 120, where the droplets 300 are vaporized by laser pulses generated by the pulse laser generator 140. The photons emitted from the target plasma are collected by the collector 110 and reflected to EUV scanning module 600. In some embodiments, the molten target is fed to the droplet generator 440 by a target feeding system 400.

The target feeding system 400 includes a container 410, a heating device 420, and a feeding tube 430. In some instances, the target is tin or lithium and the target has to be melted before it can be fed into the droplet generator 440. Both lithium and tin have relatively low melting points, compared to many commonly seen structural materials. Lithium has a melting point of 180° C. or 357° F. Tin melts at 231.9° C. or 449.5° F. The container 410 has to withstand high pressure from an inert gas, such as argon, to generate droplets. The pressure sometimes can be as high as over 1000 psi. In some embodiments, the container 410 is made of a metal, such as steel, nickel, tantalum, zirconium, tungsten, molybdenum, a semi-metal, such as graphite, or a metal alloy of the foregoing metals. In some other embodiment, the container 410 includes a steel outer shell and an inner lining made of a ceramic material such as zirconia, magnesia, alumina, and silicon graphite.

The heating device 420 is configured to heat the container 410 or the target materials in the container 410 to a temperature higher than the melting temperature. That way, the target would stay melted in the container 410 for continuous feeding into the droplet generator 440. The heating device 420 can be a heating coil wrapped around the container 410 if the container 410 is made of a metal. In cases where the container 410 has a steel outer shell and a ceramic inner lining, a heating coil surrounding the container may not be an ideal set-up as ceramic materials are usually poor thermal conductors. In some embodiments, the heating device 420 is an ohmic heater immersed in the molten form of the target. To prevent heat dissipation, the container 410 is enclosed in an insulation chamber 405.

The feeding tube 430 carries molten target from the container 410 to and the droplet generator 440. Arranged in this manner, the majority of the target is stored in the container 410 and is melted by the thermal energy from the heating device 420. In some instances, to ensure continuous target feeding and droplet generation, the container 410, the feeding tube 430 and the droplet generator 440 are subject to pressure from the inert gas used to expel droplets. In those instances, the container 410 and the feeding tube 430 are constructed to withstand pressure no less than, for example, 1000 psi.

Figure 3:
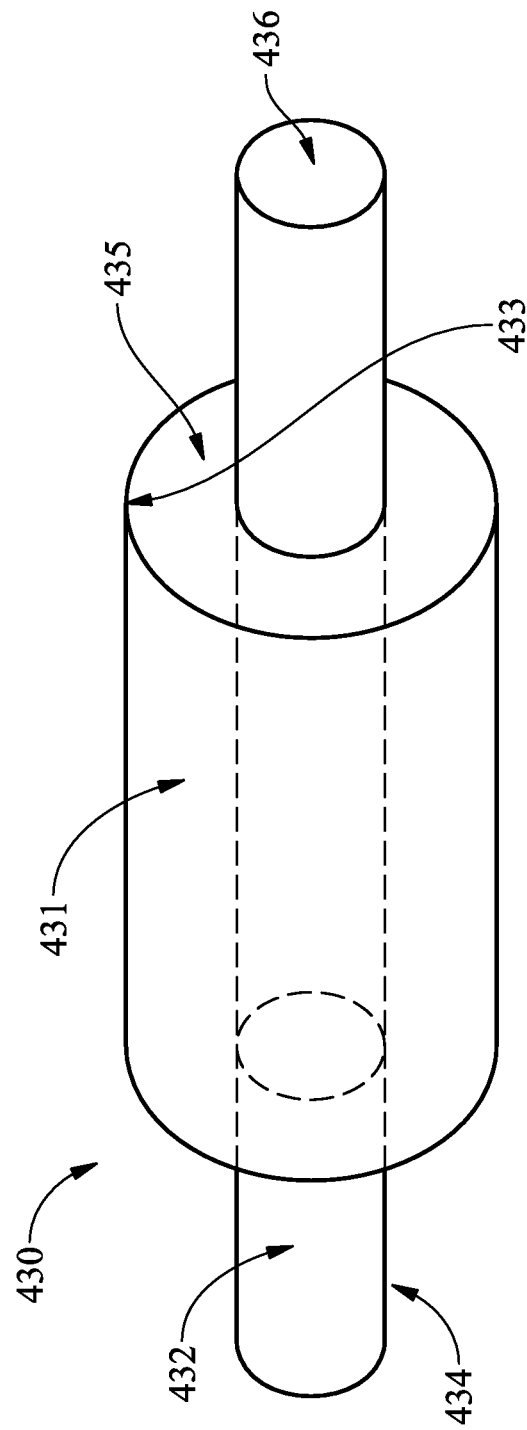
FIG. 3 is a diagrammatic view of a section of a feeding tube of the target feeding system of the EUV lithography system of FIG. 2, according to aspects of the present disclosure.

FIG. 3 is a schematic perspective view of a section of the feeding tube 430, according to aspects of the present disclosure. The feeding tube 430 may include several insulation features to ensure minimum heat loss between the container 410 and the droplet generator 440. In some embodiments, the feeding tube 430 includes an outer tube 431 and an inner tube 432. In these embodiments, the outer tube 431 and the inner tube 432 are made of stainless steel, such as Type 304 stainless steel. In some instances, the inner tube 432 is positioned coaxially within the outer tube 431. The outer tube 431 includes an inner surface 433 and the inner tube 432 includes an outer surface 434. The inner surface 433 and the outer surface 434 define an annular lumen 435 between the outer tube 431 and the inner tube 432. The inner tube 432 includes an inner lumen 436. In some instances, the molten target, such as molten tin or lithium, is carried in the inner lumen 436. The annular lumen 435 is sealed air-light. In some instances, the annular lumen 435 is subject to a vacuum. In those instances, the annular lumen 435 and the outer tube 431 function as a vacuum insulation jacket to insulate heat from the inner tube 432. In some embodiments, the inner tube 432 does not share the same longitudinal axis with the outer tube 431. The vacuum insulation jacket functions as long as an annular lumen exists.

Figure 4:
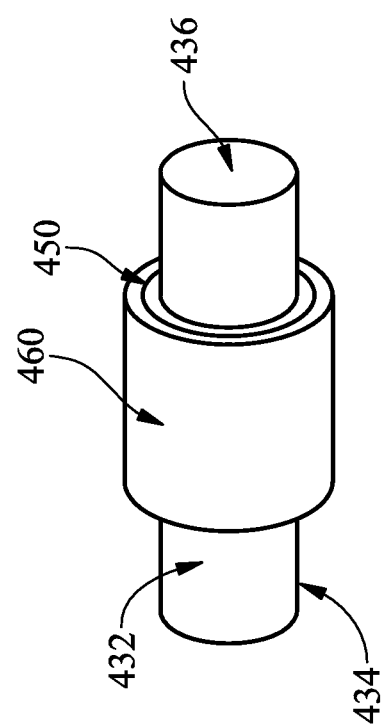
FIG. 4 is diagrammatic view of a section of an inner tube of the feeding tube of FIG. 3, according to aspects of the present disclosure.

Shown in FIG. 4 is a schematic perspective view of the inner tube 432 of the feeding tube 430, according to aspects of the present disclosure. In some embodiments, the inner tube 432 includes a heat reflection layer 450 over the outer surface 434 of the inner tube 432. In some embodiments, the heat reflection layer 450 is surrounded by a heat insulation layer 460. The heat reflection layer 450 reflects heat back towards the outer surface 434 of the inner tube 432. The heat insulation layer 460 insulates heat from the molten target carried in the inner tube 432. Both the heat reflection layer 450 and the heat insulation layer 460 can be coating layers and can include more than one layer of the same or different materials. The heat reflection layer 450 is usually formed of metals. In some instances, the heat reflection layer 450 includes metal particles embedded in polymer matrix and is applied over the outer surface 434 of the inner tube 432 by coating methods known in the art. The heat insulation layer 460 is usually formed of ceramic materials in some embodiments. In some embodiments, the heat insulation layer 460 includes ceramic particles dispersed in a suspension solution and applied over the heat reflection layer 450 by coating techniques known in the art.

Referring back to FIG. 2, both the insulation chamber 405 and the insulation features of the target feeding tube 430 reduce heat loss from the target feeding system. Nevertheless, heat loss from the target tube 430 is inevitable. In some instances, the droplet generator 440 includes a heating unit separate from the heating device 420 to maintain the temperature of the molten target before droplets are expelled. To better monitor and control temperature of the molten target in the target feeding system 400, a temperature gauge (or a thermal couple) is installed adjacent to the exit of the container 410 and a temperature gauge (or a thermal couple) is installed adjacent to the nozzle of the droplet generator 440. In some instances, a control system monitors the temperatures readings of the temperature gauges and determines whether to turn on the heating device 420 around or inside the container 410 or the heating unit in the droplet generator 440.

Figure 5:
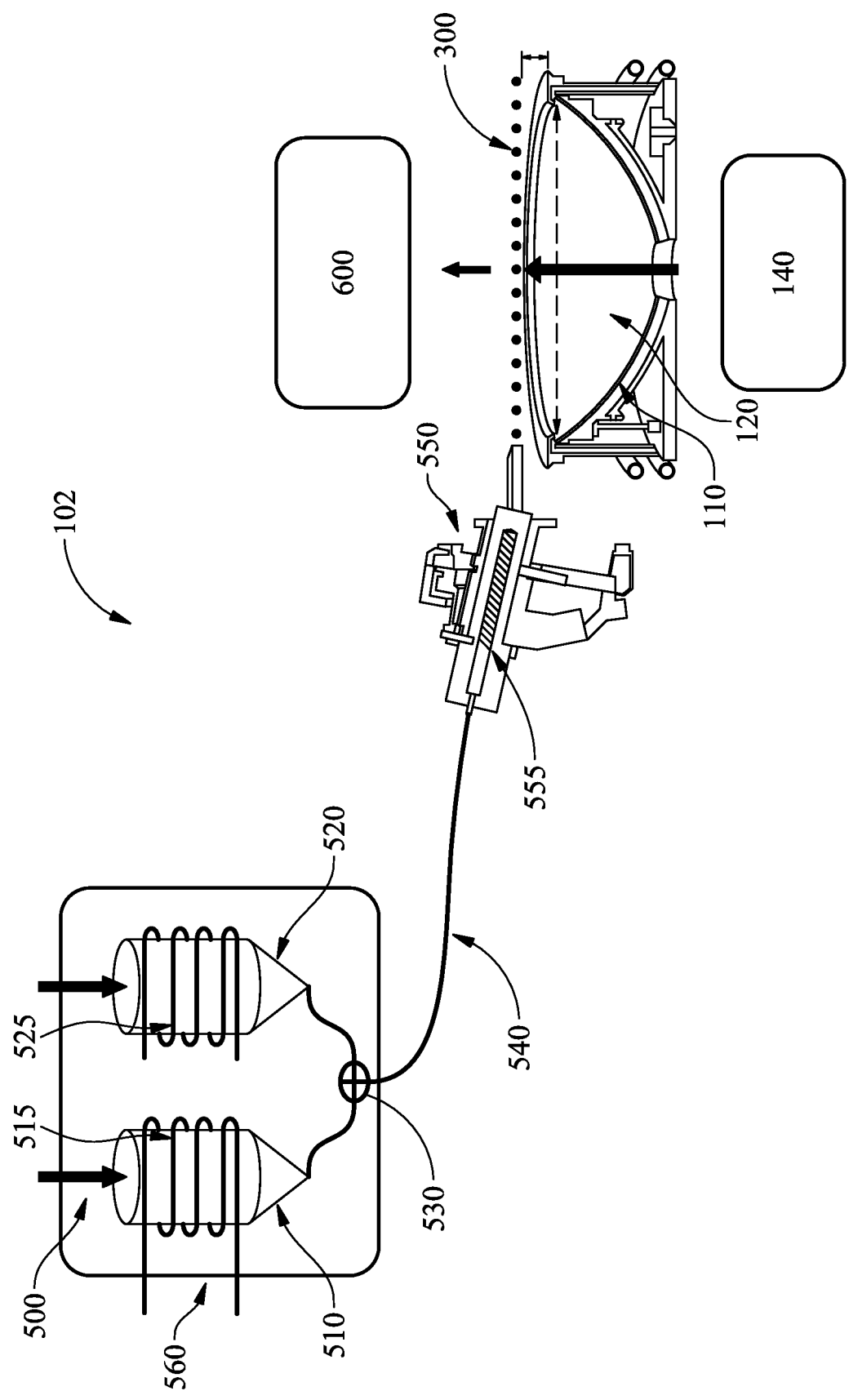
FIG. 5 is a diagrammatic view of an EUV lithography system with a target feeding system that includes two containers, according to aspects of the present disclosure.

Shown in FIG. 5 is an EUVL system 102 that include two containers, according to aspects of the present disclosure. Similar to the EUVL system 101 shown in FIG. 2, the EUVL system 102 includes a droplet generator 550 that excels droplets 300 of the molten target 555 into the source plasma vessel 120, where the droplets 300 are vaporized by laser pulses generated by the pulse laser generator 140. The photons emitted from the target plasma are collected by the collector 110 and reflected to an EUV scanning module 600. In some embodiments, the molten target is fed to the droplet generator 550 by a target feeding system 500.

In some embodiments, the target feeding system 500 includes a first container 510, a second container 520, a first heating device 515, a second heating device 525, a valve 530, an insulation chamber 560, and a target feeding tube 540. In some instances, the target is tin or lithium and the target has to be melted before it can be fed into the droplet generator 550. Both lithium and tin have relatively low melting points, compared to many commonly seen materials. Similar to the container 410 in the EUVL system 101 shown in FIG. 2, the first and second containers 510 and 520 have to withstand high pressure from an inert gas, such as argon, to generate droplets. In some instances, the inert gas fed to the first and second containers 510 and 520 come from a high pressure inert gas box, where the inert gas is pressurized. The pressure sometimes can be as high as over 1000 psi. In some embodiments, the first and second containers 510 and 520 are made of a metal, a metal alloy or a semi-metal, such as steel, nickel, tantalum, zirconium, tungsten, molybdenum, and graphite. In some other embodiment, the first and second containers 510 and 520 include a steel outer shell and an inner lining made of a ceramic material such as zirconia, magnesia, alumina, and silicon graphite.

The first and second heating devices 515 and 525 are configured to heat the first and second containers 510 and 520, or the target materials in the first and second containers 510 and 520 to a temperature higher than the melting temperature of the target. That way, the target would stay melted in the first and second containers 510 and 520 for continuous feeding into the droplet generator 550. The first and second heating devices 515 and 525 can be heating coils wrapped around the first and second containers 510 and 520 if they are made of a metal with good thermal conductivity. In cases where the first and second containers 510 and 520 are constructed with a steel outer shell and a ceramic inner lining, heating coils surrounding the containers may not be an ideal set-up as ceramic materials are usually poor thermal conductors. In those cases, the first and second heating devices 515 and 525 are ohmic heaters immersed in the molten form of the target. To prevent heat dissipation, the first and second containers 510 and 520 are enclosed in the insulation chamber 560.

In an alternative arrangement according to aspects of the present disclosure, the first heating device 515 and the second heating device 525 can be separately controlled and energized. In some instances, the valve 530 is switchable between a first position and a second position. In the first position, the valve 530 allows the first container 510 to be in fluid communication with the droplet generator 550; and in the second position, the valve 530 allows the second container 520 to be in fluid communication with the droplet generator 550. When the valve 530 is at the first position, the first container 510 is online and responsible for feeding molten target to the droplet generator 550 through the target feeding tube 540. At this time, the second container 520 is offline and the second heating device 525 may be set at a lower level to save energy. In addition, when the second container 520 is offline, the pressure exerted to the second container 520 may also be set at a lower level. Similarly, when the valve 530 is switched to the second position, the second container 520 is online and dedicated to feed molten target to the droplet generator 550 through the target feeding tube 540. The offline first container 510 may be subject to a lower temperature and pressure setting to save resources.

The valve 530 makes possible non-stop feeding of target to the droplet generator 550. As the valve 530 allows alternating feeding from the first container 510 or the second container 520, the offline container can be replenished with fresh target materials such as tin and lithium, while the online container continues to feed target to the droplet generator 550. In some instances, the target feeding system 500 includes more than two containers with separately controlled heating devices and a valve switchable between more than two positions. While a two-container alternating system can provide non-stop target feeding, a third or even a fourth container may be necessary to function as a back-up unit, in case the first container 510 and the second container 520 has to be taken offline for maintenance.

Similar to the feeding tube 430 in the EUVL system 101, the feeding tube 540 carries molten target from the first container 510 or the second container 520 to the droplet generator 550. Arranged in this manner, the majority of the target is stored in the first and second containers 510 and 520, and are melted by the thermal energy supplied by the first and second heating devices 515 and 525. Because the first and second containers 510 and 520 may be subject to high inert gas pressure as high as over 1000 psi, the first and second containers 510 and 520 are constructed to withstand pressures in that range.

In some embodiments, the target feeding tube 540 is constructed with an outer tube and a coaxial inner tube tubes similar to those shown in FIG. 3. The annular lumen between the outer surface of the inner tube and the inner surface of the outer tube is sealed air-tight. The annular lumen may include a vacuum such that the outer tube and the annular lumen together serve as a vacuum insulation jacket for the inner tube, where the molten target is carried. In addition, at least in some instances, the inner tube of the target feeding tube 540 includes a heat reflection layer over the inner tube and a heat insulation layer over the heat reflection layer. The heat insulation layer insulates heat from the molten target carried in the inner tube of the target feeding tube 540 and the heat reflection layer reflects heat back towards the outer surface of the inner tube. Both the heat insulation layer and the heat reflection layer can be coated and can include more than one layer of the same or different materials. The heat insulation layer may be formed of ceramic materials. The heat reflection layer may be formed of metals. In some instances, the heat reflection layer includes metal particles embedded in polymer matrix and is applied over the outer surface of the inner tube by coating methods known in the art. In some embodiments, the heat insulation layer includes ceramic particles dispersed in a suspension and applied over the heat reflection layer by coating techniques known in the art.

As shown in FIG. 5, both the insulation chamber 560 and the insulation features of the target feeding tube 540 reduce heat loss from the target feeding system 102. Nevertheless, heat loss from the target tube 540 is inevitable. In some instances, the droplet generator 550 includes a heating unit separate from the first and second heating devices 515 and 525 to maintain the temperature of the molten target at the droplet generator 550 before droplets are expelled. To better monitor and control temperature of the molten target in the target feeding system 500, a temperature gauge (or a thermal couple) is installed adjacent to the exit of the first and second containers 510, 520, and a temperature gauge (or a thermal couple) is installed adjacent to the nozzle of the droplet generator 550. In some instances, a control system monitors the temperatures readings of the temperature gauges and determines whether to turn on the first heating device 515, the second heating device 525, or the heating unit in the droplet generator 550.

Figure 6:
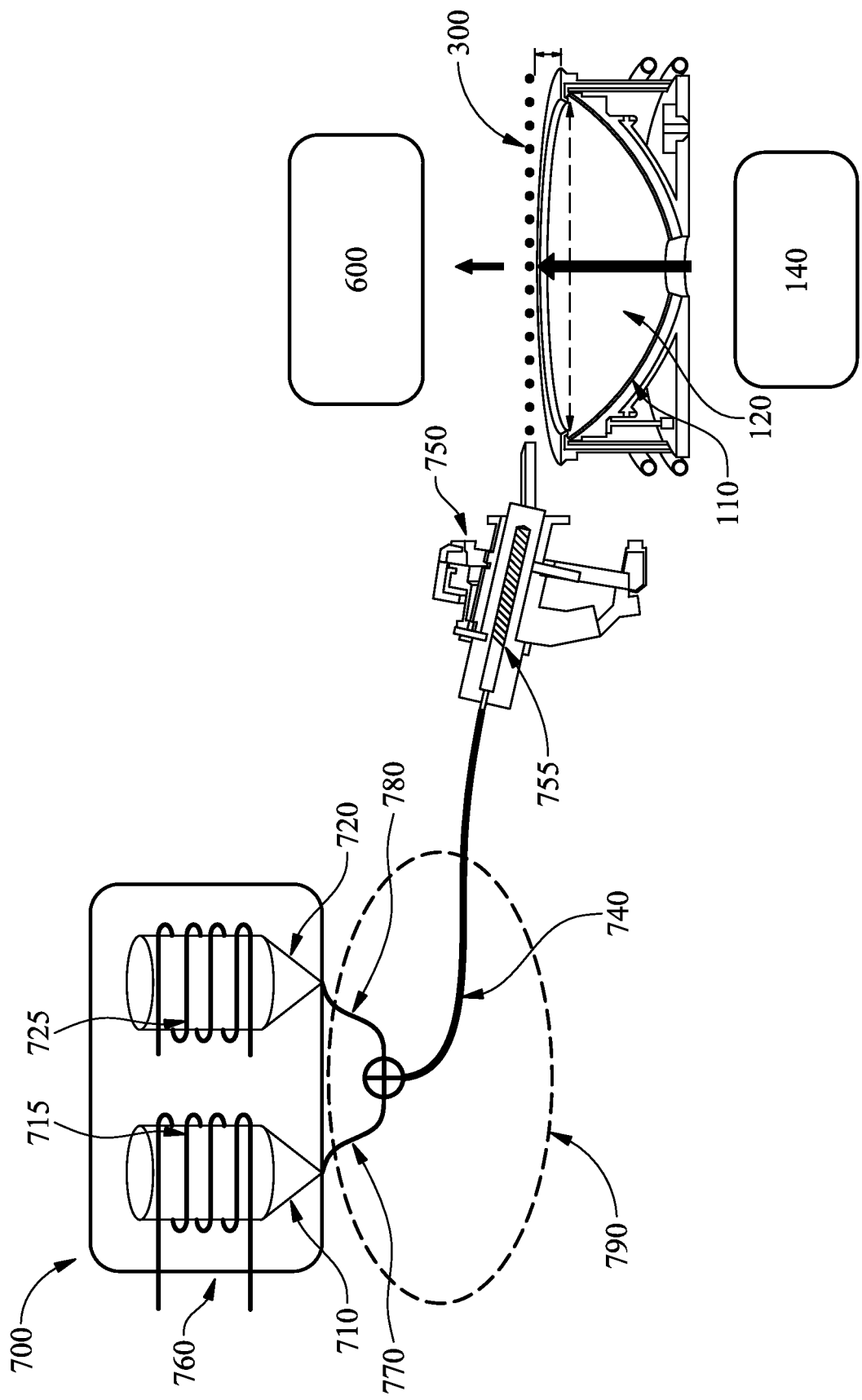
FIG. 6 is a diagrammatic view of an EUV lithography system with a target feeding system that includes two containers and heated target feeding tubes, according to aspects of the present disclosure.

Shown in FIG. 6 is an EUVL system 103 that includes two containers and heated target feeding tubes, according to aspects of the present disclosure. Similar to the EUVL system 102 shown in FIG. 5, the EUVL system 103 includes a droplet generator 750 that excels droplets 300 of the molten target 755 into the source plasma vessel 120, where the droplets 300 are vaporized by laser pulses generated by the pulse laser generator 140. The photons emitted from the target plasma are collected by the collector 110 and reflected to an EUV scanning module 600. In some embodiments, the molten target is not stored in the droplet generator 750, but is fed to the droplet generator 750 by a target feeding system 700.

In some embodiments, the target feeding system 700 includes a first container 710, a second container 720, a first heating device 715, a second heating device 725, a valve 730, an insulation chamber 760, a first connecting tube 770, a second connecting tube 780, a tube heater 790, and a target feeding tube 740. In some instances, the target is tin or lithium and the target has to be melted before it can be fed into the droplet generator 750. Both lithium and tin have relatively low melting points. Similar to the containers 510 and 520 in the EUVL system 102 shown in FIG. 5, the first and second containers 710 and 720 have to withstand high pressure from an inert gas, such as argon, to generate droplets. In some instances, the inert gas fed to the first and second containers 710 and 720 come from a high pressure inert gas box, where the inert gas is pressurized. The pressure sometimes can be as high as over 1000 psi. In some embodiments, the first and second containers 710 and 720 are made of a metal, a metal alloy or a semi-metal, such as steel, nickel, tantalum, zirconium, tungsten, molybdenum, and graphite. In some other embodiment, the first and second containers 710 and 720 include a steel outer shell and an inner lining made of a ceramic material such as zirconia, magnesia, alumina, and silicon graphite.

The first and second heating devices 715 and 725 are configured to heat the first and second containers 710 and 720, or the target materials in the first and second containers 710 and 720 to a temperature higher than the melting temperature of the target. That way, the target would stay melted in the first and second containers 710 and 720 for continuous feeding into the droplet generator 750. The first and second heating devices 715 and 725 can be heating coils or heating jackets wrapped around the first and second containers 710 and 720 if they are made of a metal with good thermal conductivity. In cases where the first and second containers 710 and 720 are constructed with a steel outer shell and a ceramic inner lining, heating coils surrounding the containers may not be an ideal set-up as ceramic materials are usually poor thermal conductors. In those cases, the first and second heating devices 715 and 725 are ohmic heaters immersed in the molten form of the target. To prevent heat dissipation, the first and second containers 710 and 20 are enclosed in the insulation chamber 760.

In an alternative arrangement according to aspects of the present disclosure, the first heating device 715 and the second heating device 725 can be separately controlled and energized. In some instances, the valve 730 is switchable between a first position and a second position. In the first position, the valve 730 allows the first container 710 to be in fluid communication with the droplet generator 750; and in the second position, the valve 730 allows the second container 720 to be in fluid communication with the droplet generator 750. When the valve 730 is at the first position, the first container 710 is online and responsible for feeding molten target to the droplet generator 750 through the target feeding tube 740. At this time, the second container 720 is offline and the second heating device 725 may be set at a lower level to save energy. In addition, when the second container 720 is offline, the pressure exerted to the second container 720 may also be set at a lower level. Similarly, when the valve 730 is switched to the second position, the second container 720 is online and dedicated to feed molten target to the droplet generator 750 through the target feeding tube 740. The offline first container 710 may be subject to a lower temperature and pressure setting to save resources.

The valve 730 makes possible non-stop feeding of target to the droplet generator 750. As the valve 730 allows alternating feeding from the first container 710 or the second container 720, the offline container can be replenished with fresh target materials, such as tin and lithium, while the online container continues to feed target to the droplet generator 750. In some instances, the target feeding system 700 includes more than two containers with separately controlled heating devices and a valve switchable between more than two positions. While a two-container alternating system can provide non-stop target feeding, a third or even a fourth container may be necessary to function as a back-up container, in case that the first container 710 and the second container 720 has to be taken offline for maintenance.

Similar to the feeding tube 540 in the EUVL system 102, the feeding tube 740 carries molten target from the first container 710 or the second container 720 to the droplet generator 750. Arranged in this manner, the majority of the target is stored in the first and second containers 710 and 720, and are melted by the thermal energy supplied by the first and second heating devices 715 and 725. Because the first and second containers 710 and 720 may be subject to high inert gas pressure as high as over 1000 psi, the first and second containers 710 and 720 are constructed to withstand pressures in that range.

In some embodiments, the first connecting tube 770, the second connecting tube 780, the valve 730, and the target feeding tube 740 are not individually insulated, but are put in contact with the tube heater 790. In some instances, the tube heater 790 can be heating coils wrapped around the first connecting tube 770, the second connecting tube 780, the valve 730, and the target feeding tube 740. In some other instances, the tube heater 790 is a heating jacket. In still over instances, the tube heather 790 is a thermal bath vessel fully enclosing the target feeding tube 740 and the thermal bath vessel is filled with a mineral oil or a fluid heating medium that has a operation temperature higher than the melting point of the target. In those instances, the temperature of the mineral oil or fluid heating medium is controlled by a circulation heater that heats and circulates the mineral oil or fluid heating medium in the thermal bath vessel.

Temperature of the first connecting tube 770, the second connecting tube 780, the valve 730, and the target feeding tube 740 are monitored by thermometers or thermo couples installed thereon. During normal operation, the tube heater 790 is not energized unless the temperature at any of the monitoring thermo couples falls to a level that may affect the droplet generation. Additionally, during normal operations, the tube heater 790 functions as a heat insulator, preventing heat from the tubes and valves to dissipate. From time to time, the EUVL system 103 may go through scheduled or unscheduled maintenances. For example, the collector 110 and the source plasma vessel 120 require cleaning and purging from time to time to remove contaminants. During such maintenances, the droplet generator 750 is heated to keep the molten target 755 in liquid form and the tube heater 790 is energized to maintain the molten target in the first connecting tube 770, the second connecting tube 780, the valve 730, and the target feeding tube 740.

Figure 7:
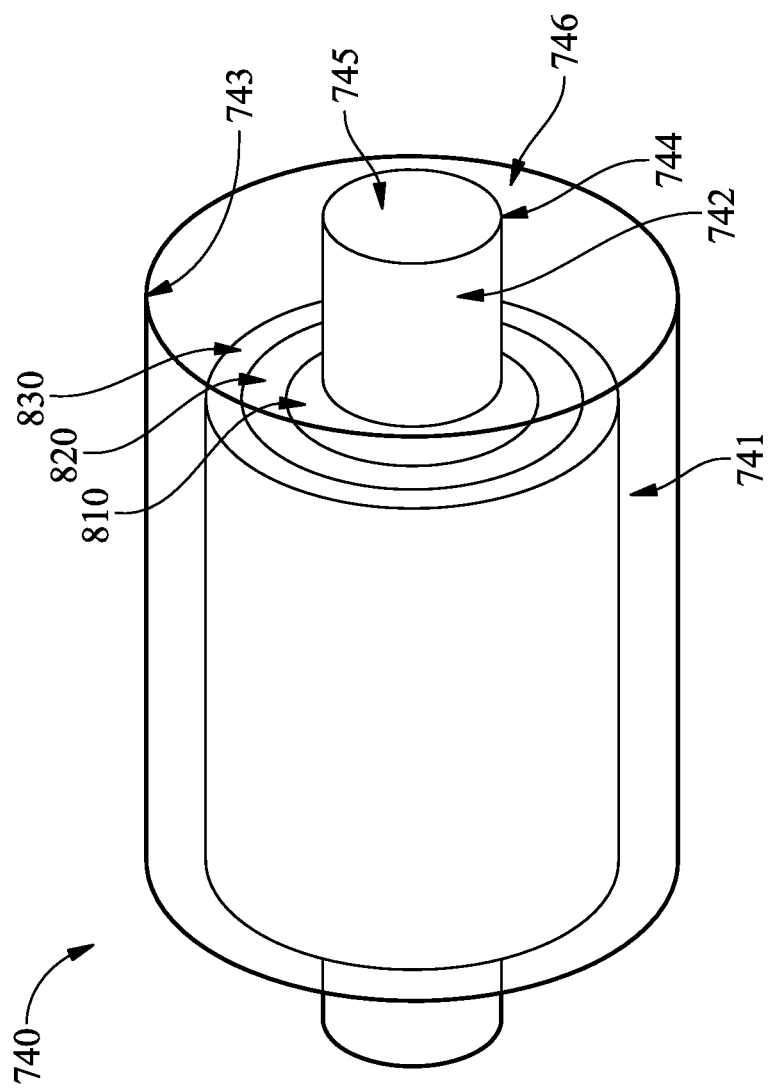
FIG. 7 is diagrammatic view of a section of a target feeding tube, according to aspects of the present disclosure.

In some embodiment, the target feeding tube 740 includes a construction shown in FIG. 7. In those embodiments, the target feeding tube 740 includes an outer tube 741 and an inner tube 742. The outer tube 741 includes an inner surface 743 and the inner tube 742 includes an outer surface 744. The inner tube 742 defines a lumen 745 that carries the molten target, such molten tin or molten lithium. The inner surface 743 and the outer surface 744 define an annular lumen 746. In some instances, the annular lumen 746 is sealed air-tight. In some instances, the annular lumen 746 includes a vacuum. In some embodiments, the target feeding tube 740 can be heated at least during a shutdown or maintenance of the EUVL system 103 or maintenance of the droplet generator 750. In some instances, the inner tube 742 of the target feeding tube 740 includes a heating layer 810 over the outer surface 744. The heating layer 810 may be a heating jacket or a layer of heating coil wrapped around the outer surface 744. In some instances, electrical energy directing to the heating layer 810 can be connected through wires that go along the outer surface 744 or through the annular lumen 746. In some other instances, electrical energy for the heating layer 810 can be conducted through the inner tube 742 and a heat reflection layer 820. In some implementations, the heat reflection layer 820 can be a coating containing metal particles, such as copper particles, silver particles, and nickel particles, and can be made to conduct electricity in instances where the electricity is going through the heat reflection layer 820. In some other implementations, the heat reflection layer 820 can be a coating containing metal oxide, such as aluminum oxide and titanium oxide. The heat reflection layer 820 also serves another function- to reflect heat radiating from the outer surface 744 back to the inner tube 742. In some instances, a heat insulation layer 830 is coated or disposed over the heat reflection layer 820. The heat insulation layer 830 is usually made with ceramic materials and prevents heat from the inner tube 742 from dissipating out. Both the heat reflection layer 820 and the heat insulation layer 830 can be coating layers and can include more than one layer of the same or different materials. In some instances, the heat reflection layer 820 includes metal or metal oxide particles embedded in polymer matrix and is applied over the heating layer 810 by coating methods known in the art. In some embodiments, the heat insulation layer 830 includes ceramic particles dispersed in a suspension solution and applied over the heat reflection layer 820 by coating techniques known in the art.

In some instances, the constructions of the target feeding tube 430 in the EUVL system 101 (shown in FIG. 2) and the target feeding tube 540 in the EUVL system 102 (shown in FIG. 5) incorporate the construction shown in FIG. 7. In those instances, both the target feeding tube 430 and the target feeding tube 540 include a heating layer over the outer surface of the inner tube, a heat reflection layer over the heating layer, and a heat insulation layer over the heat reflection layer.

The present disclosure provides an extreme ultraviolet (EUV) lithography system. The system includes an EUV scanning module; an EUV collector to collect EUV radiation and direct the same to the EUV scanning module; a droplet generator for generating droplets of a molten form of a metal; a pulse laser generator to act on the droplets of the molten form of the metal to generate plasma as a source of the EUV radiation; and a target feeding system. The target feeding system includes a container for holding the metal, a heating device configured to heat the metal in the container to a temperature higher than a melting temperature of the metal, and a feeding tube having an upstream end connecting to the container and a downstream end connecting to the droplet generator such that the container is in fluid communication with the droplet generator.

The present disclosure also provides a target feeding system for a droplet generator, which includes a container for holding a molten form of a metal; a heating device configured to heat the metal in the container to a temperature higher than a melting temperature of the metal; and a feeding tube having an upstream end connecting to the container and a downstream end connecting to the droplet generator such that the container is in fluid communication with the droplet generator.

In addition, the present disclosure provides a system for continuously feeding target into a droplet generator. The system includes a first container and a second container for holding a molten form of a metal; a heating device configured to heat the metal in the first and second containers to a temperature higher than a melting temperature of the metal; a valve connecting to the first and second containers, the valve being switchable at least between a first position and a second position; a feeding tube having an upstream end connecting to the valve and a downstream end connecting to the droplet generator such that the valve is in fluid communication with the droplet generator, wherein in the first position, the first container is in fluid communication with the droplet generator and in the second position, the second container is in fluid communication with the droplet generator.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) lithography system, comprising:
   an EUV scanning module;
   an EUV collector to collect EUV radiation and direct the same to the EUV scanning module;
   a droplet generator for generating droplets of a molten form of a metal;
   a pulse laser generator to act on the droplets of the molten form of the metal to generate plasma as a source of the EUV radiation; and
   a target feeding system, including:
      a container for holding the metal,
      a heating device configured to heat the metal in the container to a temperature higher than a melting temperature of the metal, and
      a feeding tube having an upstream end connecting to the container and a downstream end connecting to the droplet generator such that the container is in fluid communication with the droplet generator,
   wherein the feeding tube comprises an outer tube and an inner tube,
   wherein the feeding tube further comprises a heat reflection layer over an outer surface of the inner tube.

2. The EUV lithography system of claim 1, wherein the inner tube is coaxially positioned within the outer tube.

3. The EUV lithography system of claim 1, wherein the outer surface of the inner tube and an inner surface of the outer tube define an annular lumen and the annular lumen is air tight.

4. The EUV lithography system of claim 1, wherein the feeding tube further comprises a heat insulation layer over the heat reflection layer.

5. The EUV lithography system of claim 4, wherein the feeding tube further comprises a heating layer between the outer surface of the inner tube and the heat reflection layer.

6. A target feeding system for a droplet generator, comprising:
   a container for holding a molten form of a metal;
   a heating device configured to heat the metal in the container to a temperature higher than a melting temperature of the metal; and
   a feeding tube having an upstream end connecting to the container and a downstream end connecting to the droplet generator such that the container is in fluid communication with the droplet generator,
   wherein the container comprises a steel outer shell and a ceramic inner lining.

7. The system of claim 6, wherein the feeding tube comprises an outer tube and an inner tube coaxially positioned within the outer tube.

8. The system of claim 7, wherein the inner and outer tubes are made of stainless steel.

9. The system of claim 6,
   wherein the feeding tube comprises an outer tube and an inner tube,
   wherein an outer surface of the inner tube and an inner surface of the outer tube define an annular lumen and the annular lumen is air tight.

10. The system of claim 9, wherein the feeding tube further comprises a heat reflection layer over the outer surface of the inner tube.

11. The system of claim 10, wherein the feeding tube further comprises a heat insulation layer over the heat reflection layer.

12. The system of claim 11, wherein the feeding tube further comprises a heating layer between the outer surface of the inner tube and the heat reflection layer.

13. A system for continuously feeding target into a droplet generator, comprising:
   a first container and a second container for holding a molten form of a metal;
   a heating device configured to heat the metal in the first and second containers to a temperature higher than a melting temperature of the metal;
   a valve connecting to the first and second containers, the valve being switchable at least between a first position and a second position; and
   a feeding tube having an upstream end connecting to the valve and a downstream end connecting to the droplet generator such that the valve is in fluid communication with the droplet generator,
   wherein in the first position, the first container is in fluid communication with the droplet generator and in the second position, the second container is in fluid communication with the droplet generator,
   wherein the feeding tube comprises an outer tube and an inner tube,
   wherein the feeding tube further comprises a heat reflection layer over an outer surface of the inner tube.

14. The system of claim 13, wherein the inner tube is coaxially positioned within the outer tube.

15. The system of claim 13, wherein the inner and outer tubes are made of stainless steel.

16. The system of claim 13, wherein the outer surface of the inner tube and an inner surface of the outer tube define an annular lumen and the annular lumen is air-tight.

17. The system of claim 13, wherein the feeding tube further comprises a heat insulation layer over the heat reflection layer.

18. The system of claim 13, wherein the feeding tube further comprises a heating layer between the outer surface of the inner tube and the heat reflection layer.

19. The EUV lithography system of claim 1, wherein the container comprises a steel outer shell and a ceramic inner lining.

20. The system of claim 13, wherein each of the first and second containers comprises a steel outer shell and a ceramic inner lining.

* * * * *